(12) United States Patent
Singh et al.

(10) Patent No.: US 12,300,311 B1
(45) Date of Patent: May 13, 2025

(54) MULTIPURPOSE WORDLINE UNDERDRIVE CIRCUITS, DEVICES, AND SYSTEMS

(71) Applicants: Advanced Micro Devices, Inc., Santa Clara, CA (US); ATI Technologies ULC, Markham (CA)

(72) Inventors: Sahilpreet Singh, Markham (CA); Russell Schreiber, Austin, TX (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 184 days.

(21) Appl. No.: 17/971,763

(22) Filed: Oct. 24, 2022

(51) Int. Cl.
  *G11C 11/418* (2006.01)

(52) U.S. Cl.
  CPC .................................. *G11C 11/418* (2013.01)

(58) Field of Classification Search
  CPC ................................................... G11C 11/418
  See application file for complete search history.

(56) References Cited

U.S. PATENT DOCUMENTS

| | | | | |
|---|---|---|---|---|
| 7,505,345 B2 * | 3/2009 | Wang | .................... | G11C 11/418 365/207 |
| 8,391,097 B2 * | 3/2013 | Chan | ....................... | G11C 8/08 365/189.11 |
| 8,593,859 B2 * | 11/2013 | Agari | ....................... | G11C 5/14 365/229 |
| 9,082,507 B2 * | 7/2015 | Holla | ....................... | G11C 7/02 |
| 10,541,013 B1 * | 1/2020 | Schreiber | ............ | G11C 11/4085 |
| 2016/0035397 A1 * | 2/2016 | Pilo | ....................... | G11C 11/417 365/154 |
| 2016/0172023 A1 * | 6/2016 | Nii | ........................... | G11C 5/14 365/154 |
| 2017/0110164 A1 * | 4/2017 | Cheng | ...................... | G11C 7/10 |
| 2017/0287551 A1 * | 10/2017 | Sahu | ........................ | G11C 8/08 |
| 2018/0068711 A1 * | 3/2018 | Pilo | ........................ | G11C 11/417 |
| 2018/0166127 A1 * | 6/2018 | Pathak | ..................... | G11C 7/04 |
| 2019/0066772 A1 * | 2/2019 | Singh | ................... | G11C 11/418 |
| 2021/0082496 A1 * | 3/2021 | Mathur | ................ | G11C 11/419 |
| 2023/0260572 A1 * | 8/2023 | Wu | ....................... | G11C 11/412 365/154 |

* cited by examiner

*Primary Examiner* — Khamdan N. Alrobaie

(74) *Attorney, Agent, or Firm* — Greenberg Traurig, LLP

(57) ABSTRACT

A multipurpose wordline underdrive circuit includes a wordline driver and a pulldown network. The pulldown network includes a first current-carrying terminal electrically coupled to the wordline driver and a second current-carrying terminal electrically coupled to a control signal. The pulldown network also includes a current-regulation terminal electrically coupled to an additional control signal. Various other devices, systems, and methods are also disclosed.

20 Claims, 8 Drawing Sheets

MULTIPURPOSE WORDLINE UNDERDRIVE CIRCUITS, DEVICES, AND SYSTEMS

BACKGROUND

Memory devices (e.g., static random-access memory devices) often include bitcells that store individual bits of data. Certain designs and/or implementations of such memory devices render the bitcells somewhat unstable, thereby impairing the performance and/or reliability of such memory devices. To address and/or counteract this instability, memory device designers often integrate wordline underdrive circuits into their memory devices. Unfortunately, some wordline underdrive circuits have shortcomings and/or deficiencies that render them inefficient and/or wasteful in certain scenarios. The instant disclosure, therefore, identifies and addresses a need for multipurpose circuits, devices, and systems capable of achieving and/or providing wordline underdrive for improved bitcell stability as well as wordline drive booster for increased access speeds and/or improved writability.

BRIEF DESCRIPTION OF THE DRAWINGS

The accompanying drawings illustrate a number of exemplary implementations and are a part of the specification. Together with the following description, these drawings demonstrate and explain various principles of the instant disclosure.

Figure 1:
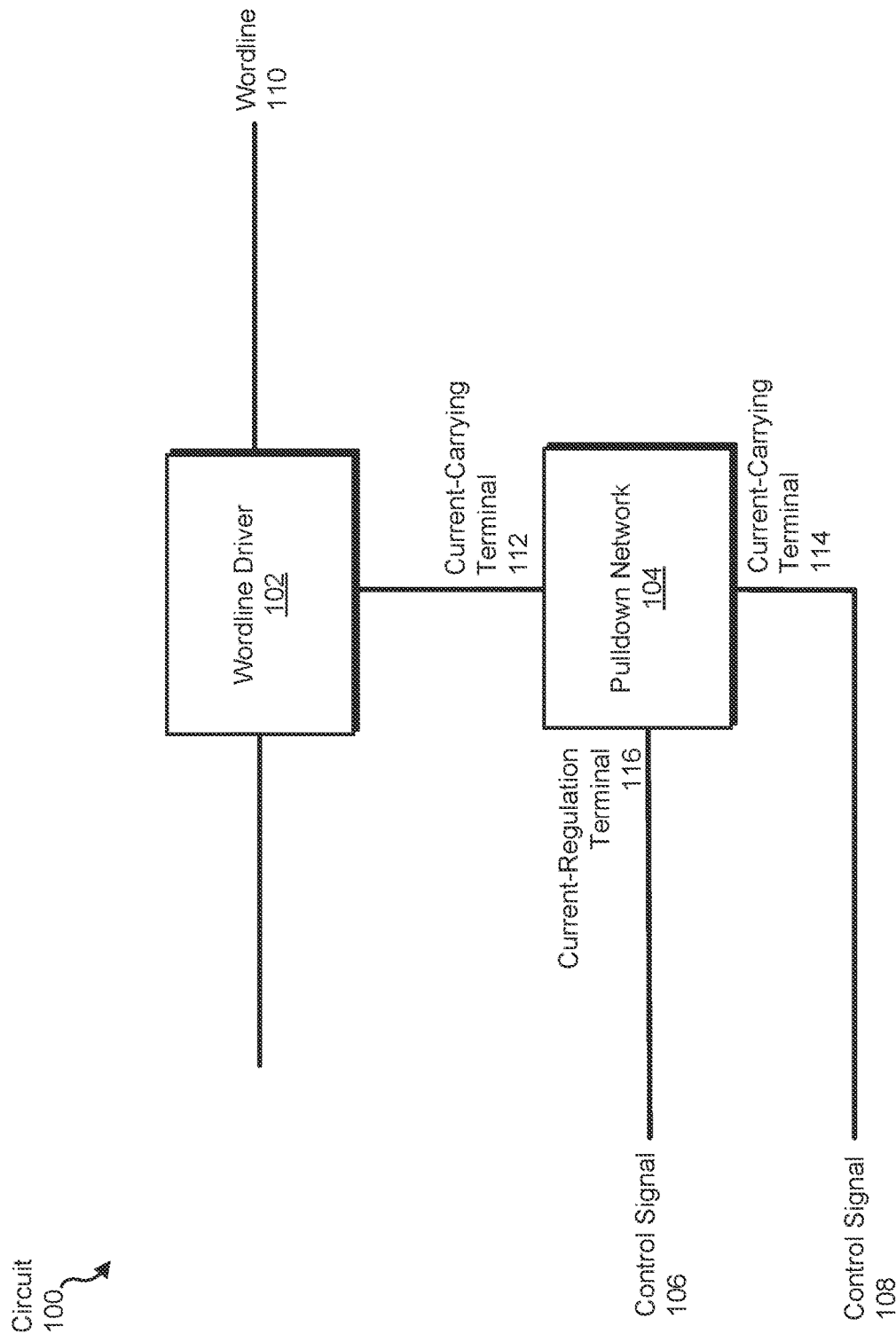
FIG. 1 is a diagram of an exemplary multipurpose wordline underdrive circuit according to one or more implementations of this disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the instant disclosure covers all modifications, equivalents, and alternatives falling within the scope of the appended claims.

DETAILED DESCRIPTION OF EXEMPLARY IMPLEMENTATIONS

The present disclosure describes various multipurpose circuits, devices, and systems capable of achieving and/or providing wordline underdrive for improved bitcell stability as well as wordline booster for increased access speeds. In some examples, the term "wordline underdrive" can refer to and/or represent a process and/or scenario in which the voltage of a wordline is driven below and/or under the full range of the corresponding voltage source. In one example, wordline underdrive can be applied and/or implemented to increase the stability of the bitcells connected to the wordline. In some traditional technologies, the application and/or implementation of wordline underdrive impaired the speed of accessing bitcells, the writability of bitcells, and/or the power efficiency of the underlying memory device, such as a static random-access memory (SRAM) device.

Wordline underdrive is not necessarily needed by all SRAM devices. Unfortunately, knowing whether certain SRAM devices need to activate wordline underdrive can be impossible and/or unrealistic until such SRAM devices are produced and/or tested at high volume. As will be explained in greater detail below, the circuits, devices, and/or systems described herein can provide various benefits and/or advantages over certain traditional implementations of wordline underdrive technologies. For example, a wordline underdrive circuit can be configured to implement an underdrive mode that stabilizes the corresponding bitcell. In other words, if turned on, this configurable underdrive mode can enable the wordline underdrive circuit to temporarily pull down the wordline's voltage every time the wordline is used and/or asserted.

In addition, this wordline underdrive circuit can also be configured to implement a booster mode that creates a pullup path on the wordline connected to the bitcell, thereby strengthening the wordline to support better slew rates and increased access speeds. In other words, if the underdrive mode is turned off, this configurable wordline underdrive circuit enhances and/or boosts the drive on the pullup path of the wordline.

In some examples, the wordline underdrive circuit includes multiple field-effect transistors arranged in parallel with one another. In such examples, the drains of the field-effect transistors can be coupled to a control signal instead of being coupled to ground. In one example, the gates of the field-effect transistors can be coupled to outputs of logic gates in which programmable signals are compared with the control signal to control activating and/or deactivating the underdrive mode and/or the booster mode. By facilitating the implementation of both the underdrive mode and the drive booster mode, this wordline underdrive circuit is able to support multiple purposes and/or functionalities.

Specifically, when wordline underdrive is needed, control logic activates the underdrive mode and/or deactivates the drive booster mode via the wordline underdrive circuit. However, when wordline underdrive is not needed, the control logic deactivates the underdrive mode and/or activates the booster mode via the wordline underdrive circuit. As a result, the wordline underdrive circuit is able to provide additional benefits even when the wordline underdrive is not needed by improving access speeds of the bitcells and/or the underlying memory device. In addition, when wordline underdrive is turned on, the design of the wordline underdrive circuit can cause the decrease, reduction, and/or dip in voltage on the wordline to decay and/or slowly return to the full range of the voltage source. By doing so, the design of the wordline underdrive circuit can also simultaneously support, provide, and/or facilitate improved bitcell stability.

In some examples, a wordline underdrive circuit includes a wordline driver and a pulldown network with a first terminal electrically coupled to the wordline driver. In such examples, the wordline underdrive circuit also includes at least one logic gate whose inputs are electrically coupled to a set of programmable signals and whose output is electrically coupled to a second terminal of the pulldown network. Additionally or alternatively, the wordline underdrive circuit includes an inverter whose input is electrically coupled to one of the programmable signals and whose output is electrically coupled to a third terminal of the pulldown network.

In some examples, the wordline driver includes an inverter whose input is electrically coupled to a wordline input signal and whose output is electrically coupled to a wordline output signal. In one example, the wordline driver also includes a transistor with a first terminal electrically coupled to the wordline output signal, a second terminal electrically coupled to the wordline input signal, and/or a third terminal electrically coupled to the first terminal of the pulldown network. In one example, the transistor includes and/or represents a field-effect transistor whose source is electrically coupled to the wordline output signal, gate is electrically coupled to a wordline input signal, and/or drain is electrically coupled to the first terminal of the pulldown network.

In some examples, the wordline underdrive circuit includes and/or represents a transistor with a first terminal electrically coupled to a supply voltage, a second terminal electrically coupled to a control signal, and/or a third terminal electrically coupled to the first terminal of the pulldown network. In one example, the pulldown network includes and/or represents a set of transistors that each include a first terminal electrically coupled to the wordline driver, a second terminal electrically coupled to the output of the logic gate, and/or a third terminal electrically coupled to the output of the inverter. For example, the set of transistors can include and/or represent a set of field-effect transistors each with a source electrically coupled to the wordline driver, a gate electrically coupled to the output of the logic gate, and/or a drain electrically coupled to the output of the inverter. Additionally or alternatively, the logic gate constitutes and/or represents a set of logic gates (e.g., one or more AND gates) that each include an output electrically coupled to the gate of one of the field-effect transistors, a first input electrically coupled to the one of the programmable signals, and/or a second input electrically coupled to another one of the programmable signals.

In some examples, the pulldown network is configured to implement an underdrive mode when activated by the output of the inverter. The underdrive mode causes a temporary reduction in a voltage level of an output of the wordline driver. In such examples, the temporary reduction in the voltage level of the output of the wordline driver partially decays as a function of time while the wordline driver is activated. In one example, the temporary reduction in the voltage level is configurable via the set of programmable signals. In this example, the underdrive mode causes the pulldown network to operate as a voltage divider that produces the temporary reduction in the voltage level of the output of the wordline driver.

In some examples, the pulldown network is configured to implement a drive booster mode when deactivated by the output of the inverter. In such examples, the booster mode creates a pullup path on an output of the wordline driver to support increased speeds for accessing a bitcell associated with the wordline driver. In one example, the inverter includes and/or represents a logic inverter and/or a complementary metal-oxide semiconductor (CMOS) inverter.

In some examples, a device (e.g., a memory device, a processing device, and/or a computer) includes and/or represents a bitcell and a wordline underdrive circuit electrically coupled to the bitcell. In one example, the wordline underdrive circuit includes a wordline driver and a pulldown network with a first terminal electrically coupled to the wordline driver. In this example, the wordline underdrive circuit also includes at least one logic gate whose inputs are electrically coupled to a set of programmable signals and whose output is electrically coupled to a second terminal of the pulldown network. Additionally or alternatively, the wordline underdrive circuit includes an inverter whose input is electrically coupled to one of the programmable signals and whose output is electrically coupled to a third terminal of the pulldown network.

In some examples, a method for creating and/or manufacturing a wordline underdrive circuit includes coupling a first terminal of a pulldown network to a wordline driver. In such examples, the method also includes coupling inputs of at least one logic gate to a set of programmable signals. In one example, the method further includes coupling an output of the logic gate to a second terminal of the pulldown network. In this example, the method additionally includes coupling an input of an inverter to one of the programmable signals. Additionally or alternatively, the method includes coupling an output of the inverter to a third terminal of the pulldown network.

The following will provide, with reference to FIGS. 1-6, detailed descriptions of exemplary devices, systems, and/or corresponding implementations that facilitate both wordline underdrive for improved bitcell stability as well as wordline booster for increased access speeds and/or improved writability. Detailed descriptions of an exemplary method for creating, manufacturing, and/or assembling a wordline underdrive circuit for improved bitcell stability, increased access speeds, and/or improved bitcell writability will be provided in connection with FIG. 7.

FIG. 1 shows an exemplary circuit 100 that facilitates, provides, and/or supports wordline underdrive for improved bitcell stability as well as wordline booster for increased access speeds and/or improved writability. As illustrated in FIG. 1, exemplary circuit 100 includes and/or represents a wordline driver 102 and/or a pulldown network 104. In some examples, pulldown network 104 can include and/or represent a current-carrying terminal 112 electrically coupled to wordline driver 102 and a current-carrying terminal 114 electrically coupled to a control signal 108. In such examples, pulldown network 104 can include and/or represent a current-regulation terminal 116 of the pulldown network electrically coupled to a control signal 106.

In some examples, wordline driver 102 can include and/or represent any type or form of circuitry, component configuration, and/or feature that drives and/or asserts a wordline for accessing, reading, and/or writing to one or more bitcells within a memory device. As will be described in greater detail below in connection with FIGS. 3-5, wordline driver 102 can include and/or represent an inverter and a transistor electrically coupled to one another in the path of the wordline signal.

In one example, pulldown network 104 can include and/or represent any type or form of circuitry, component configuration, and/or feature that establishes and/or creates a pulldown path for an asserted wordline when the corresponding wordline underdrive circuit is activated and/or a pullup path for an asserted wordline when the corresponding wordline underdrive circuit is deactivated. As will be described in greater detail below in connection with FIGS. 3-5, pulldown network 104 can include and/or represent a set of transistors electrically coupled in parallel with one another. In one example, the gates of these transistors can be independently controllable to facilitate activating one or more of these transistors on an independent and/or individual basis.

Circuit 100 in FIG. 1 can be implemented in a variety of ways. Accordingly, circuit 100 in FIG. 1 can take on and/or assume various forms and/or configurations consistent with and/or variant to the above descriptions. For example, all or portions of exemplary circuit 100 can constitute and/or represent all or portions of exemplary circuits 200, 300, 400, or 500 in FIG. 2, 3, 4, or 5, respectively. In addition, although various components and/or elements of exemplary circuits 100, 200, 300, 400, or 500 are illustrated as discrete features, one or more of those components and/or elements can alternatively be combined and/or consolidated into a single unit and/or device. For example, the individual components and/or devices illustrated in FIG. 1 can be implemented and/or united in a single circuit, unit, and/or device.

In some examples, current-carrying terminal 112 includes and/or represents the source of at least one transistor included in pulldown network 104, and/or current-carrying terminal 114 includes and/or represents the drain of the transistor included in pulldown network 104. In such examples, current-regulation terminal 116 includes and/or represents the gate of the transistor included in pulldown network 104.

In some examples, control signals 106 and 108 can constitute and/or represent outputs from certain control logic, such as logic gates 206(1)-(N) and/or inverter 208 in FIGS. 2-5. In other examples, control signals 106 and 108 can be controlled and/or modified by firmware, fuses, and/or other means separate from control logic.

Figure 2:
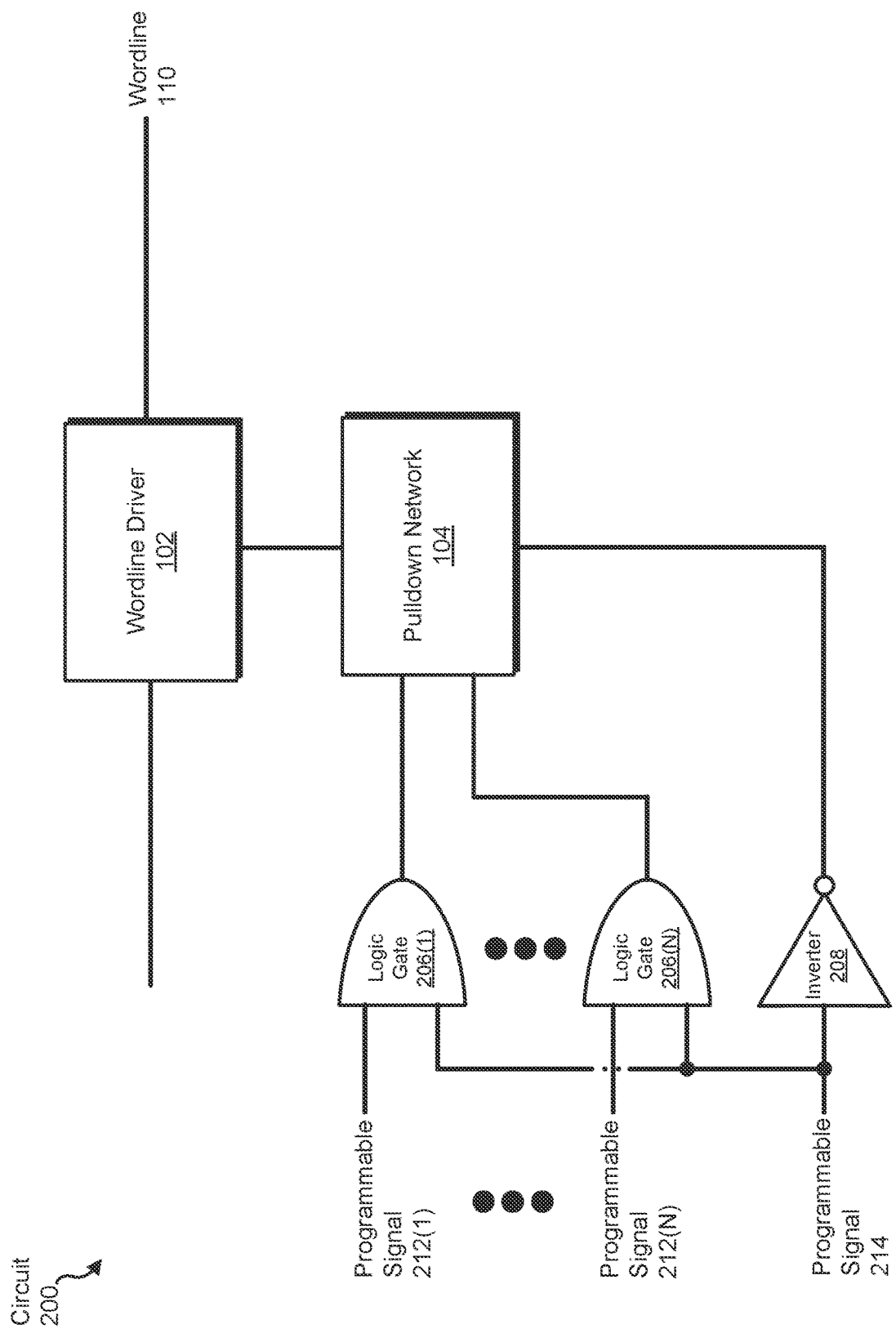
FIG. 2 is a diagram of an exemplary multipurpose wordline underdrive circuit according to one or more implementations of this disclosure.

FIG. 2 shows an exemplary circuit 200 that facilitates, provides, and/or supports wordline underdrive for improved bitcell stability as well as wordline booster for increased access speeds and/or improved writability. As illustrated in FIG. 2, exemplary circuit 200 includes and/or represents a wordline driver 102 and/or a pulldown network 104. In some examples, pulldown network 104 can include and/or represent a first terminal electrically coupled to wordline driver 102. Additionally or alternatively, exemplary circuit 100 includes and/or represents one or more logic gates 206(1)-(N) whose inputs are electrically coupled to one or more programmable signals 212(1)-(N) and/or whose output is electrically coupled to a second terminal of pulldown network 104.

In some examples, exemplary circuit 100 also includes and/or represents an inverter 208 whose input is electrically coupled to programmable signal 214 and/or whose output is electrically coupled to a third terminal of pulldown network 104. In one example, the output of wordline driver 102 includes and/or represents a wordline 110 that is electrically coupled to one or more bitcells within a memory device. In this example, the wordline can control access to, activation of, and/or addressing for the bitcells within the memory device.

In some examples, logic gates 206(1)-(N) can each include and/or represent any type or form of device, component, and/or circuit that implements and/or performs a Boolean function and/or operation on one or more inputs to render a single output. In one example, one or more of logic gates 206(1)-(N) can include and/or represent an AND gate that implements and/or performs a logical conjunction operation and/or function on two inputs. Additional examples of logic gates 206(1)-(N) include, without limitation, OR gates, XOR gates, NOT gates, NAND gates, NOR gates, XNOR gates, combinations or variations of one or more of the same, and/or any other suitable logic gates.

In some examples, inverter 208 can each include and/or represent any type or form of device, component, and/or circuit that implements and/or performs a logical negation function and/or operation on an input to render an inverted output. In one example, inverter 208 can include and/or represent a logic inverter device and/or a CMOS inverter.

Figure 3:
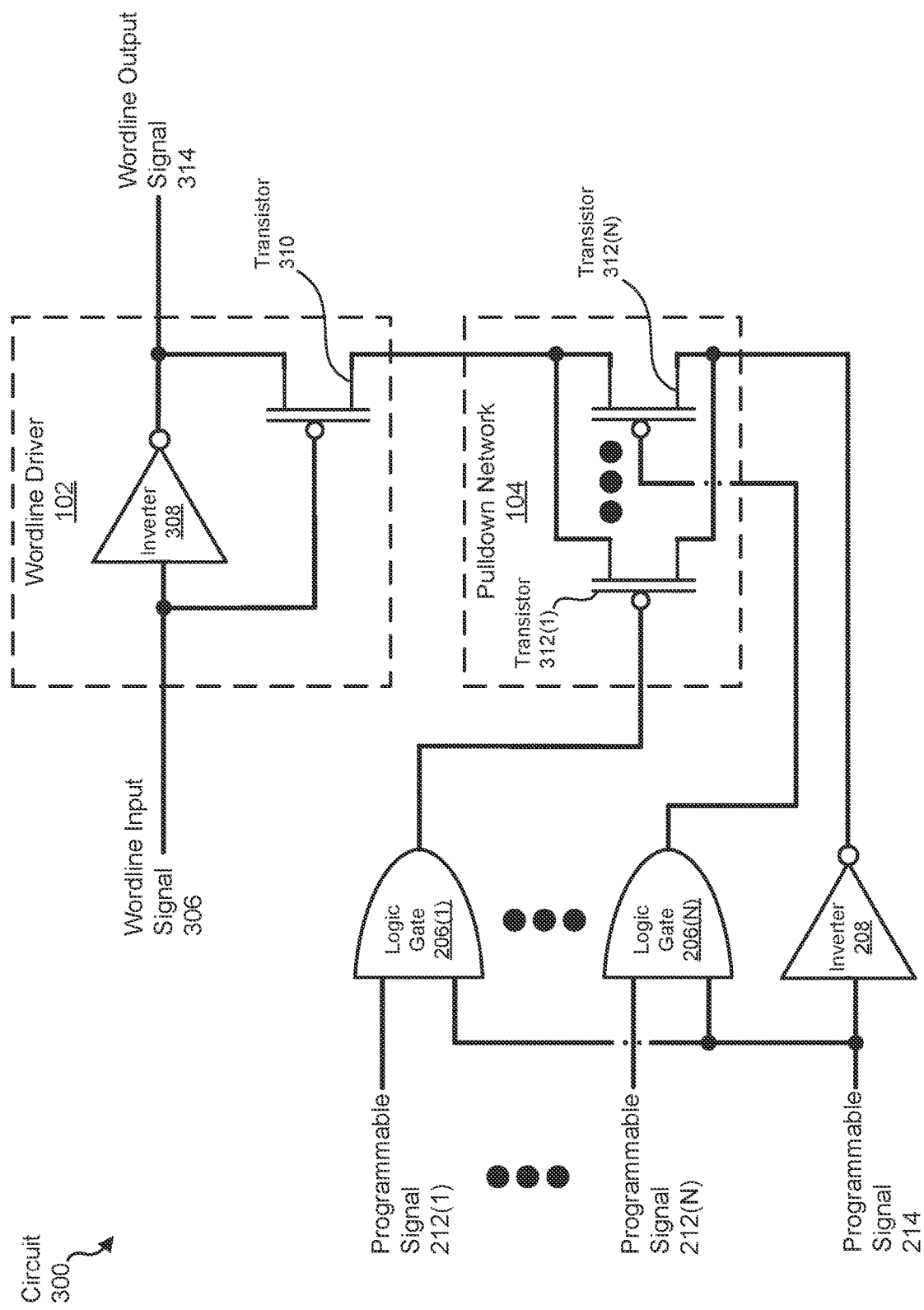
FIG. 3 is a diagram of an exemplary multipurpose wordline underdrive circuit according to one or more variations of this disclosure.

FIG. 3 shows an exemplary circuit 300 that facilitates, provides, and/or supports wordline underdrive for improved bitcell stability as well as wordline drive booster for increased access speeds. In some examples, circuit 300 can include and/or represent certain devices, components, and/or features that perform and/or provide similar or identical functionalities as described above in connection with circuit 100 in FIG. 1 and/or circuit 200 in FIG. 2.

As illustrated in FIG. 3, exemplary circuit 300 includes and/or represents wordline driver 102 and pulldown network 104 electrically coupled to one another. In some examples, wordline driver 102 can include and/or represent an inverter 308 whose input is electrically coupled to a wordline input signal 306 and/or whose output is electrically coupled to a wordline output signal 314. In such examples, wordline driver 102 can also include and/or represent a transistor 310 that includes a source terminal electrically coupled to wordline output signal 314, a gate terminal electrically coupled to the wordline input signal 306, and/or a drain terminal electrically coupled to a terminal of pulldown network 104.

In some examples, pulldown network 104 can include and/or represent one or more transistors 312(1)-(N) electrically coupled in parallel with one another. In such examples, each of transistors 312(1)-(N) includes a source terminal electrically coupled to wordline driver 102, a gate terminal electrically coupled to the output of one of logic gates 206(1)-(N), and/or a drain terminal electrically coupled to the output of inverter 208. In one example, the source terminal of each of transistors 312(1)-(N) is electrically coupled to the drain terminal of transistor 310 in wordline driver 102. Additionally or alternatively, the gates of transistors 312(1)-(N) can be independently controllable by the outputs of logic gates 206(1)-(N) to facilitate activating one or more of transistors 312(1)-(N) on an independent and/or individual basis.

In some examples, transistor 310 and/or transistors 312(1)-(N) can each be any type or form of transistor device. In one example, transistor 310 and/or transistors 312(1)-(N) can each include and/or represent a field-effect transistor, such as a p-channel metal-oxide-semiconductor (PMOS) transistor. Additional examples of transistor 310 and/or transistors 312(1)-(N) include, without limitation, Metal Oxide Semiconductor Field Effect Transistors (MOSFETs), n-channel metal-oxide-semiconductor (NMOS) transistors, Bipolar Junction Transistors (BJTs), Junction gate Field Effect Transistors (JFETs), insulated-gate bipolar transistors (IGBTs), combinations or variations of one or more of the same, and/or any other suitable types of transistors.

In some examples, circuit 300 can implement wordline underdrive (e.g., the underdrive mode) by setting programmable signal 214 to a binary and/or digital "1". By doing so, the drains of transistors 312(1)-(N) are pulled down to a binary and/or digital "0," which acts and/or functions as ground. In one example, upon pulling down the drains of transistors 312(1)-(N) to ground, electric charge dumps onto the output of inverter 208. This dumping of electric charge causes the output of inverter 208 to slowly float up and/or rise from the ground state because inverter 208 is unable to accommodate and/or handle the amount of current flowing from transistors 312(1)-(N). As a result, the amount of underdrive applied to wordline output signal 314 will slowly diminish, decay, and/or decrease, thereby causing wordline output signal 314 to slowly return to the full range of the voltage source of inverter 308 and/or circuit 300.

In some examples, the decay of the underdrive applied to wordline output signal 314 can provide certain benefits and/or advantages to circuit 300. For example, one or more bitcells connected to wordline output signal 314 can experience greater and/or improved stability as the corresponding bitline starts to discharge. In this example, the maximum amount of underdrive is only needed at the beginning of the assertion of wordline output signal 314. In addition, the writability of such bitcells can be impaired as the amount of underdrive applied to wordline output signal 314 increases. As a result, the decay of the underdrive applied to wordline output signal 314 can improve the bitcells' writability.

In some examples, circuit 300 can implement wordline drive booster (e.g., the booster mode) by setting programmable signal 214 to a binary and/or digital "0". By doing so, the drains of transistors 312(1)-(N) are pulled up to a binary and/or digital "1," which acts and/or functions as a voltage source. In one example, upon pulling up the drains of transistors 312(1)-(N) to ground, this voltage source strengthens and/or boosts wordline output signal 314. This strengthening of wordline output signal 314 essentially amounts to an additional pullup path for wordline output signal 314, which facilitates and/or supports increased read and/or write speeds for the corresponding bitcells.

In some examples, wordline underdrive is never applied and/or implemented by circuit 300. In other words, circuit 300 can be configured such that programmable signal 214 is always set to binary and/or digital "0", as opposed to ever being set to binary and/or digital "1". In such examples, circuit 300 can still be able to benefit and/or improve the underlying memory device by providing a drive and/or boost enhancement to the wordline, which potentially justifies and/or offsets the use of the real estate and/or area consumed by circuit 300 even if wordline underdrive is never applied and/or implemented.

In some examples, as part of the booster mode, circuit 300 can apply programmable signals 212(1)-(N) such that all of transistors 312(1)-(N) are turned on and/or activated. In such examples, while turned on and/or activated in the booster mode, transistors 312(1)-(N) can collectively strengthen, drive, and/or enhance wordline output signal 314.

Figure 4:
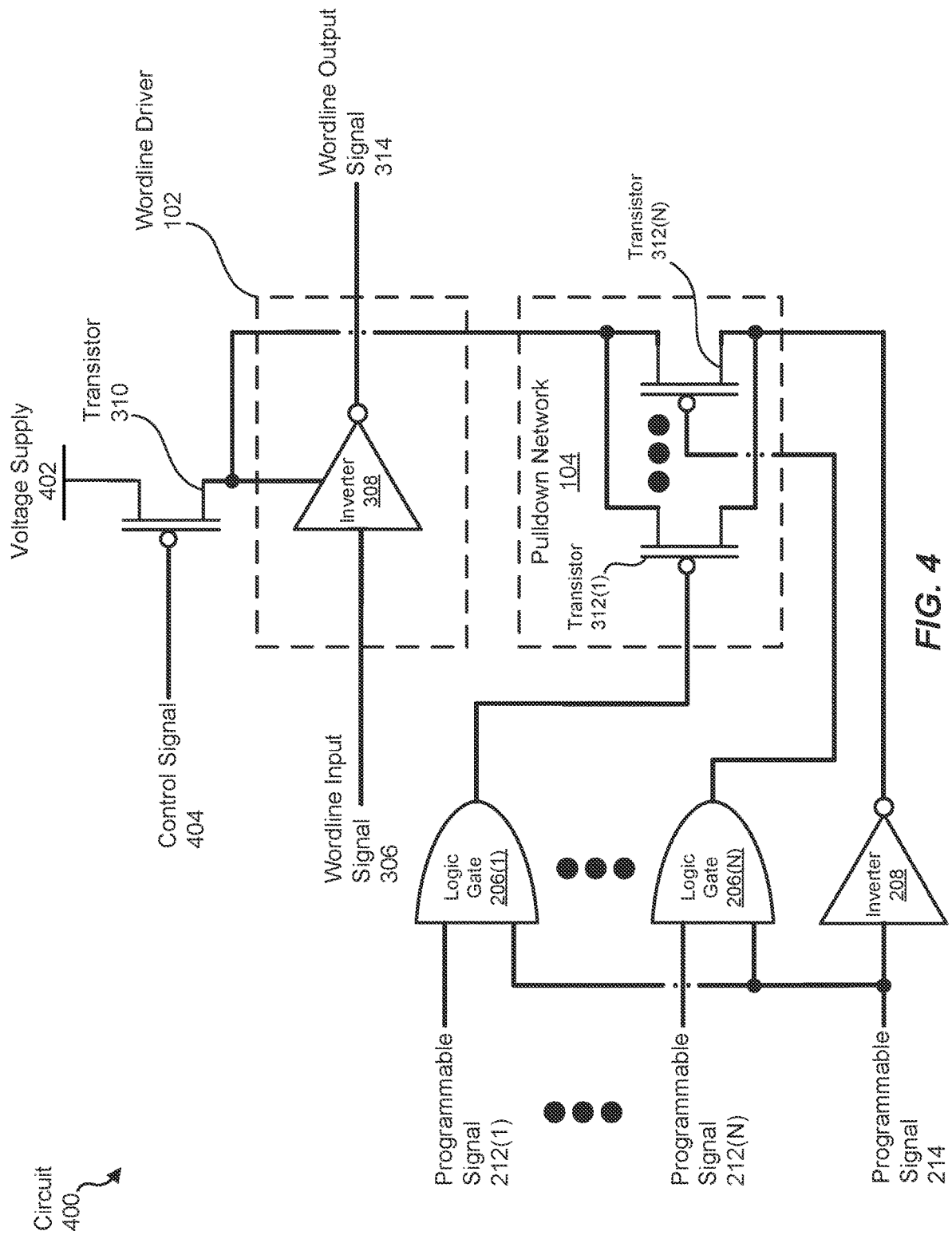
FIG. 4 is a diagram of an exemplary multipurpose wordline underdrive circuit according to one or more variations of this disclosure.

FIG. 4 shows an exemplary circuit 400 that facilitates, provides, and/or supports wordline underdrive for improved bitcell stability as well as wordline drive booster for increased access speeds and/or improved writability. In some examples, circuit 400 can include and/or represent certain devices, components, and/or features that perform and/or provide similar or identical functionalities as described above in connection with circuit 100 in FIG. 1, circuit 200 in FIG. 2, and/or circuit 300 in FIG. 3.

As illustrated in FIG. 4, exemplary circuit 400 includes and/or represents wordline driver 102 and pulldown network 104 electrically coupled to one another. In some examples, wordline driver 102 can include and/or represent an inverter 308 whose input is electrically coupled to a wordline input signal 306 and/or whose output is electrically coupled to a wordline output signal 314. In such examples, wordline driver 102 can also include and/or represent transistor 310 whose source terminal is electrically coupled to a voltage supply 402, gate terminal is coupled to a control signal 404, and/or drain terminal is electrically coupled to a power terminal of inverter 308 and/or the source terminals of transistors 312(1)-(N) in pulldown network 104. Although illustrated as being part of wordline driver 102 in FIG. 4, transistor 310 can alternatively be incorporated and/or integrated outside of and/or external to wordline driver 102 in circuit 400.

Figure 5:
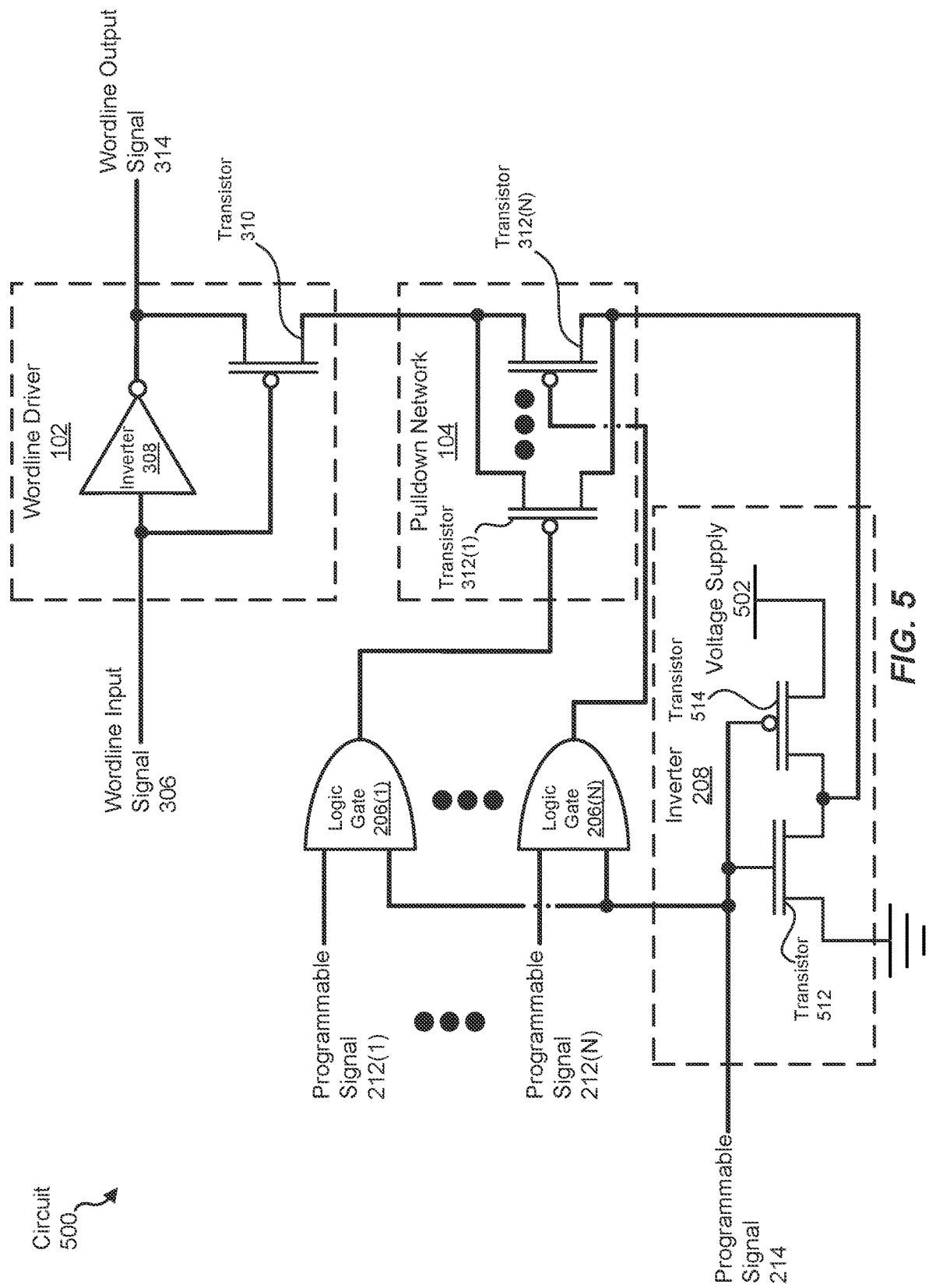
FIG. 5 is a diagram of an exemplary multipurpose wordline underdrive circuit according to one or more variations of this disclosure.

FIG. 5 shows an exemplary circuit 500 that facilitates, provides, and/or supports wordline underdrive for improved bitcell stability as well as wordline booster for increased access speeds and/or improved writability. In some examples, circuit 500 can include and/or represent certain devices, components, and/or features that perform and/or provide similar or identical functionalities as described above in connection with circuit 100 in FIG. 1, circuit 200 in FIG. 2, circuit 300 in FIG. 3, and/or circuit 400 in FIG. 4.

As illustrated in FIG. 5, exemplary circuit 500 includes and/or represents inverter 208 and pulldown network 104 electrically coupled to one another. In some examples, inverter 208 can include and/or represent a CMOS inverter consisting of transistors 512 and 514. In one example, transistor 512 includes and/or represents an NMOS transistor, and transistor 514 includes and/or represents a PMOS transistor. In this example, the source terminal of transistor 512 is electrically coupled to ground, and the drain terminal of transistor 512 is electrically coupled to the drain terminal of transistor 514. Additionally or alternatively, the source terminal of transistor 512 is electrically coupled to a voltage supply 502, and the drain terminal of transistor 514 is electrically coupled to the drain of transistor 512.

In some examples, the gate terminals of transistors 512 and 514 are electrically coupled to programmable signal 214. In one example, the drain terminals of transistors 512 and 514 in inverter 208 are electrically coupled to the drain terminals of transistors 312(1)-(N) in pulldown network 104.

Figure 6:
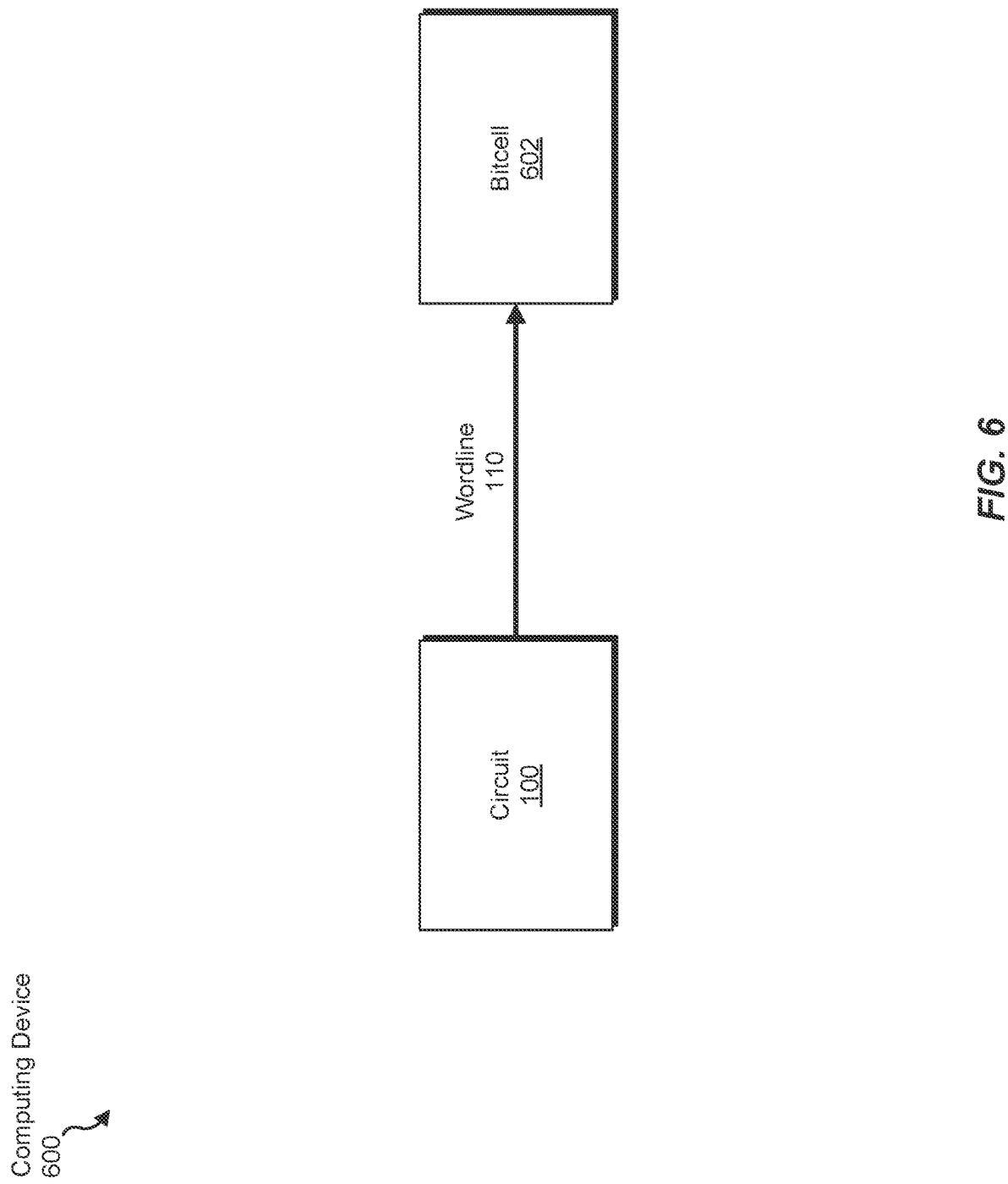
FIG. 6 is a diagram of portions of an exemplary device that includes a multipurpose wordline underdrive circuit according to one or more embodiments of this disclosure.

FIG. 6 illustrates a portion of exemplary device 600 that includes and/or represents circuit 100 and/or bitcell 602 electrically coupled to one another via wordline 110. In some examples, bitcell 602 is configured to store an individual bit of data. In one example, wordline 110 can control access to, activation of, and/or addressing for the bitcell 602 within device 600. Examples of device 600 include, without limitation, memory devices, processing devices, Central Processing Units (CPUs), Graphics Processing Units (GPUs), microprocessors, microcontrollers, Field-Programmable Gate Arrays (FPGAs), Application-Specific Integrated Circuits (ASICs), Systems-on-a-Chip (SoCs), SRAM devices, Random Access Memory (RAM) devices, Read Only Memory (ROM) devices, flash memory devices, Hard Disk Drives (HDDs), Solid-State Drives (SSDs), optical disk drives, caches, routers, switches, hubs, modems, bridges, repeaters, gateways (such as Broadband Network Gateways (BNGs)), network devices, client devices, laptops, tablets, desktops, servers, cellular phones, Personal Digital Assistants (PDAs), multimedia players, embedded systems, wearable devices, gaming consoles, portions of one or more of the same, variations or combinations of one or more of the same, and/or any other suitable device.

Figure 7:
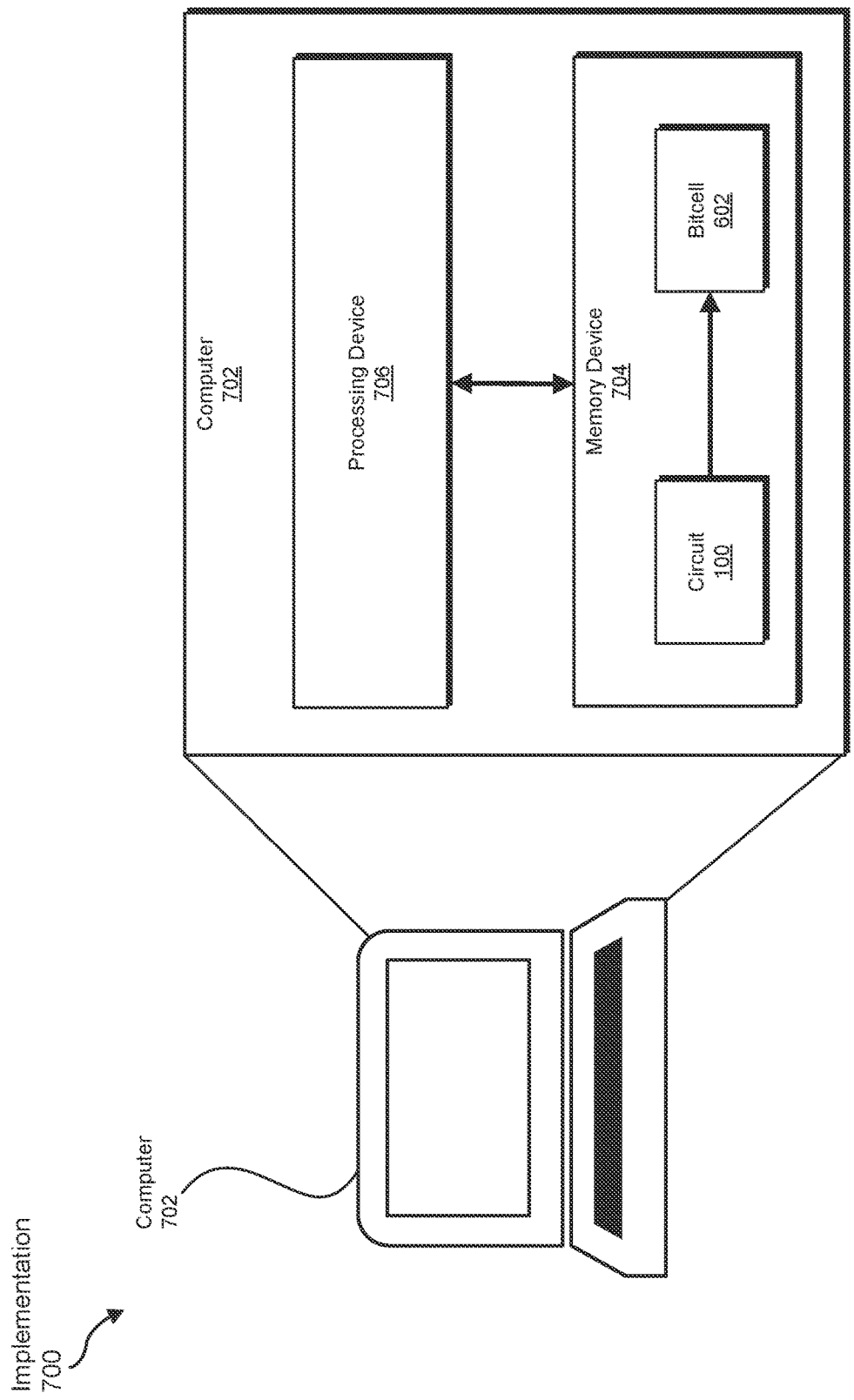
FIG. 7 is a diagram of an exemplary implementation of a multipurpose wordline underdrive circuit integrated into a memory device and/or a computer according to one or more embodiments of this disclosure.

FIG. 7 illustrates an exemplary implementation 700 involving a computing device 702. As illustrated in exemplary implementation 700 in FIG. 7, computing device 702 includes and/or represents a processing device 706 electrically coupled to a memory device 704. In some examples, memory device 704 maintains and/or stores data in various bitcells (e.g., bitcell 602). In one example, memory device 704 includes and/or contains circuit 100, which implements either the drive booster mode or the underdrive mode at any given time in connection with bitcell 602.

In some examples, processing device 706 can include and/or represent any type or form of hardware-implemented processor capable of executing computer-readable instructions. Examples of processing device 706 include, without limitation, CPUs, GPUs, microprocessors, microcontrollers, FPGAs, ASICs, SoCs, combinations or variations of one or more of the same, and/or any other type of suitable processing device.

In some examples, memory device 704 can include and/or represent any type or form of volatile or non-volatile storage device or medium capable of storing data and/or computer-readable instructions. In one example, memory device 704 includes and/or represents an SRAM device.

In some examples, the various circuits, components, and/or devices described in connection with FIGS. 1-7 can include and/or represent one or more additional circuits, components, devices, and/or features that are not necessarily illustrated and/or labeled in FIGS. 1-7. For example, such circuits, components, and/or devices can also include and/or represent additional analog and/or digital circuitry, onboard logic, transistors, resistors, capacitors, diodes, inductors, switches, registers, flipflops, connections, traces, buses, semiconductor (e.g., silicon) devices and/or structures, storage devices, circuit boards, housings, combinations or variations of one or more of the same, and/or any other suitable components that facilitate and/or support multipurpose wordline underdrive circuits. One or more of these additional circuits, components, and/or devices can be inserted and/or applied between any of the existing circuits components, and/or devices illustrated in FIGS. 1-7 consistent with the aims and/or objectives provided herein. Accordingly, the communicative and/or electrical couplings described with reference to FIGS. 1-7 can be direct connections with no intermediate components, devices, and/or nodes or indirect connections with one or more intermediate components, devices, and/or nodes.

Figure 8:
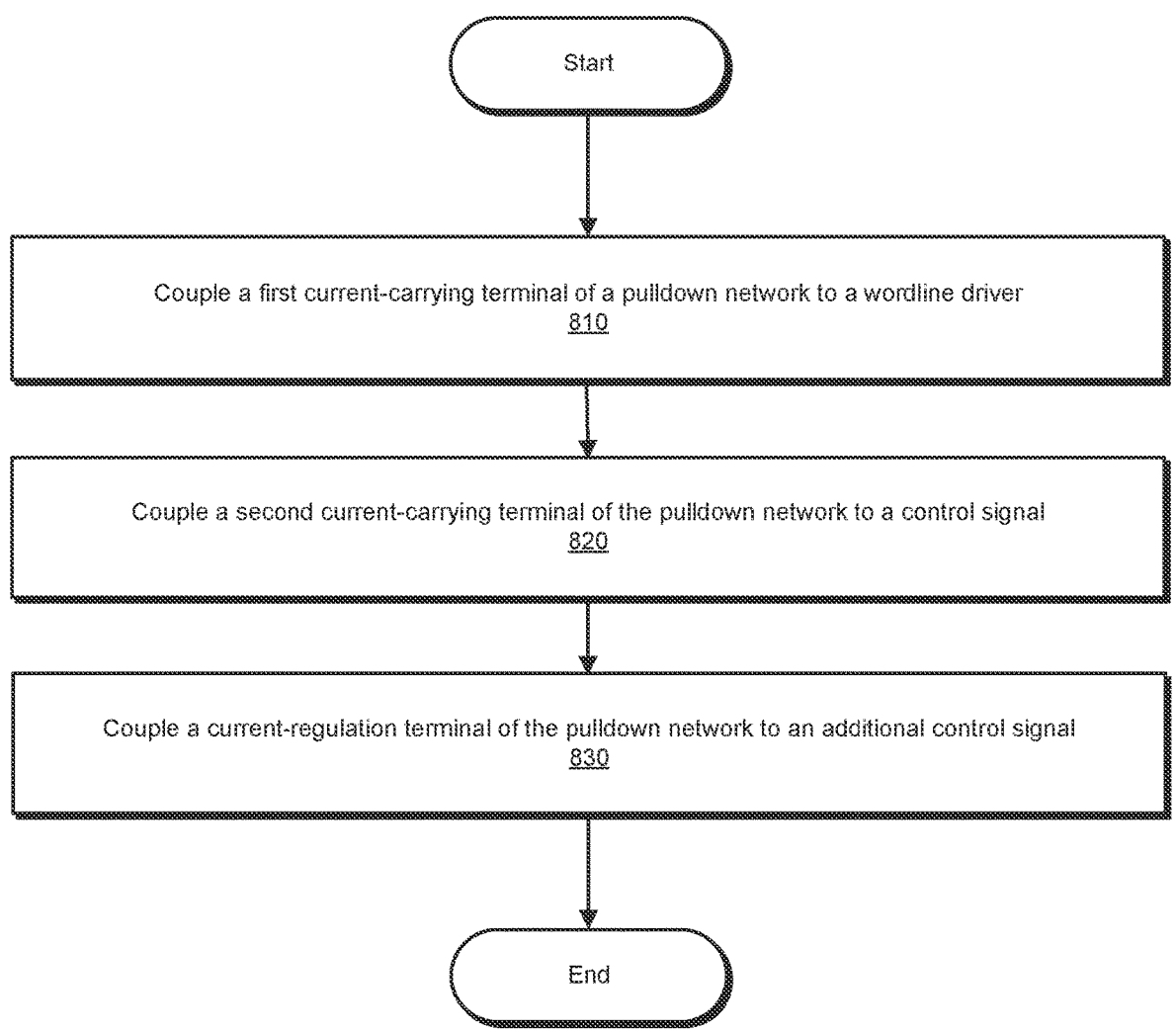
FIG. 8 is a flowchart of an exemplary method for creating multipurpose wordline underdrive circuits according to one or more implementations of this disclosure.

FIG. 8 is a flow diagram of an exemplary method 800 for achieving and/or providing wordline underdrive for improved bitcell stability as well as wordline booster for increased access speeds and/or improved writability. In one example, the steps shown in FIG. 8 can be performed and/or executed in connection with the manufacturing, assembly, and/or creation of a multipurpose wordline underdrive circuit. Additionally or alternatively, the steps shown in FIG. 8 can also incorporate and/or involve various sub-steps and/or variations consistent with the descriptions provided above in connection with FIGS. 1-7.

As illustrated in FIG. 8, exemplary method 800 include and/or involve the step of coupling a first current-carrying terminal of a pulldown network to a wordline driver (810). Step 810 can be performed in a variety of ways, including any of those described above in connection with FIGS. 1-7. For example, a memory device manufacturer or subcontractor can couple a first current-carrying terminal of a pulldown network to a wordline driver.

Exemplary method 800 also includes the step of coupling a second current-carrying terminal of the pulldown network to a control signal (820). Step 820 can be performed in a variety of ways, including any of those described above in connection with FIGS. 1-7. For example, the memory device manufacturer or subcontractor can couple a second current-carrying terminal of the pulldown network to a control signal.

Exemplary method 800 further includes the step of coupling a current-regulation terminal of the pulldown network to an additional control signal (830). Step 830 can be performed in a variety of ways, including any of those described above in connection with FIGS. 1-7. For example, the memory device manufacturer or subcontractor can couple a current-regulation terminal of the pulldown network to an additional control signal.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality. Furthermore, the various steps, events, and/or features performed by such components should be considered exemplary in nature since many alternatives and/or variations can be implemented to achieve the same functionality within the scope of this disclosure.

The devices, systems, and methods described herein can employ any number of software, firmware, and/or hardware configurations. For example, one or more of the exemplary implementations disclosed herein can be encoded as a computer program (also referred to as computer software, software applications, computer-readable instructions, and/or computer control logic) on a computer-readable medium. In one example, when executed by at least one processor, the encodings of the computer-readable medium cause the processor to generate and/or produce a computer-readable representation of an integrated circuit configured to do, perform, and/or execute any of the tasks, features, and/or actions described herein in connection with FIGS. 1-7. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and/or other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the instant disclosure. The implementations disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A circuit comprising:
   a wordline driver; and
   a pulldown network that includes:
      a first current-carrying terminal of a transistor that is electrically coupled to the wordline driver;
      a second current-carrying terminal of the transistor that is electrically coupled to a digitally programmable control signal;
      a gate of the transistor that is electrically coupled to an additional digitally programmable control signal; and
      at least one logic gate whose inputs are electrically coupled to a plurality of programmable signals and whose output is electrically coupled to the additional digitally programmable control signal.

2. The circuit of claim 1, further comprising:
   an inverter whose input is electrically coupled to one of the programmable signals and whose output is electrically coupled to the digitally programmable control signal.

3. The circuit of claim 2, wherein the logic gate comprises a set of logic gates that each include:
   an output that produces the additional digitally programmable control signal;
   a first input electrically coupled to a programmable signal; and
   a second input electrically coupled to an additional programmable signal.

4. The circuit of claim 3, wherein the set of logic gates comprises one or more logic AND gates.

5. The circuit of claim 2, wherein the inverter comprises at least one of:
   a logic inverter; or
   a complementary metal-oxide semiconductor (CMOS) inverter.

6. The circuit of claim 1, wherein the wordline driver comprises:
   an inverter whose input is electrically coupled to a wordline input signal and whose output is electrically coupled to a wordline output signal; and
   a transistor that includes:
      a first terminal electrically coupled to the wordline output signal;
      a second terminal electrically coupled to the wordline input signal; and
      a third terminal electrically coupled to the first current-carrying terminal.

7. The circuit of claim 6, wherein the transistor comprises a field-effect transistor that includes:
   a source electrically coupled to the wordline output signal;
   a gate electrically coupled to the wordline input signal; and
   a drain electrically coupled to the first current-carrying terminal.

8. The circuit of claim 1, wherein the wordline driver comprises:
   an inverter whose input is electrically coupled to a wordline input signal and whose output is electrically coupled to a wordline output signal; and
   a transistor that includes:
      a first terminal electrically coupled to a supply voltage;
      a second terminal electrically coupled to another control signal; and
      a third terminal electrically coupled to the first current-carrying terminal.

9. The circuit of claim 1, wherein the pulldown network comprises a set of transistors that each include:
   a first terminal electrically coupled to the wordline driver;
   a second terminal electrically coupled to the additional digitally programmable control signal or at least one other digitally programmable control signal; and
   a third terminal electrically coupled to the digitally programmable control signal.

10. The circuit of claim 9, wherein the set of transistors comprises a set of field-effect transistors that each include:
    a source electrically coupled to the wordline driver;
    a gate electrically coupled to the additional digitally programmable control signal; and
    a drain electrically coupled to the digitally programmable control signal.

11. The circuit of claim 1, wherein the pulldown network is configured to implement an underdrive mode when activated by the additional digitally programmable control signal, wherein the underdrive mode causes a temporary reduction in a voltage level of an output of the wordline driver.

12. The circuit of claim 11, wherein the temporary reduction in the voltage level of the output of the wordline driver partially decays as a function of time while the wordline driver is activated.

13. The circuit of claim 11, wherein the temporary reduction in the voltage level is configurable via the digitally programmable control signal and the additional digitally programmable control signal.

14. The circuit of claim 11, wherein the underdrive mode causes the pulldown network to operate as a voltage divider that produces the temporary reduction in the voltage level of the output of the wordline driver.

15. The circuit of claim 1, wherein the pulldown network is configured to implement a booster mode when deactivated, wherein the booster mode creates a pull up path on an output of the wordline driver to support increased speeds for accessing a bitcell associated with the wordline driver.

16. The circuit of claim 1, wherein:
    the first current-carrying terminal comprises a source of the transistor; and
    the second current-carrying terminal comprises a drain of the transistor.

17. A device comprising:
    a bitcell; and
    a circuit electrically coupled to the bitcell, wherein the circuit comprises:
       a wordline driver; and
       a pulldown network that includes:
          a first current-carrying terminal of a transistor that is electrically coupled to the wordline driver;
          a second current-carrying terminal of the transistor that is electrically coupled to a digitally programmable control signal;

a gate of the transistor that is electrically coupled to an additional digitally programmable control signal; and at least one logic gate whose inputs are electrically coupled to a plurality of programmable signals and whose output is electrically coupled to the additional digitally programmable control signal.

18. The device of claim 17, further comprising:

at least one logic gate whose inputs are electrically coupled to a set of programmable signals and whose output is electrically coupled to the additional digitally programmable control signal; and an inverter whose input is electrically coupled to one of the programmable signals and whose output is electrically coupled to the digitally programmable control signal.

19. The device of claim 17, wherein the device comprises at least one:

a memory device;

a processing device; or a computer.

20. A method comprising:

coupling a first current-carrying terminal of a transistor included in a pulldown network to a wordline driver;

coupling a second current-carrying terminal of the transistor to a digitally programmable control signal;

coupling a gate of the transistor to an additional control signal; and coupling inputs of at least one logic gate to a plurality of programmable signals and an output of the logic gate to the additional digitally programmable control signal.

* * * * *